(12) United States Patent
Umehara et al.

(10) Patent No.: US 11,365,274 B2
(45) Date of Patent: Jun. 21, 2022

(54) RESIN COMPOSITION, AND PREPREG, RESIN-COATED FILM, RESIN-COATED METAL FOIL, METAL-CLAD LAMINATE, AND WIRING BOARD EACH OBTAINED USING SAID RESIN COMPOSITION

(71) Applicant: PANASONIC INTELLECTUAL PROPERTY MANAGEMENT CO., LTD., Osaka (JP)

(72) Inventors: Hiroaki Umehara, Fukushima (JP); Yiqun Wang, Osaka (JP); Hiroharu Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 41 days.

(21) Appl. No.: 16/978,564

(22) PCT Filed: Mar. 11, 2019

(86) PCT No.: PCT/JP2019/009679
§ 371 (c)(1),
(2) Date: Sep. 4, 2020

(87) PCT Pub. No.: WO2019/188189
PCT Pub. Date: Oct. 3, 2019

(65) Prior Publication Data
US 2021/0017317 A1    Jan. 21, 2021

(30) Foreign Application Priority Data
Mar. 28, 2018    (JP) .............................. JP2018-063240

(51) Int. Cl.
*C08F 290/06*    (2006.01)
*C08J 5/24*    (2006.01)
(Continued)

(52) U.S. Cl.
CPC .......... *C08F 290/062* (2013.01); *B32B 15/08* (2013.01); *C08J 5/24* (2013.01); *H05K 1/056* (2013.01); *C08J 2371/12* (2013.01)

(58) Field of Classification Search
CPC .................................................. C08F 290/062
See application file for complete search history.

(56) References Cited

U.S. PATENT DOCUMENTS

2008/0300350 A1    12/2008    Ohno et al.
2018/0002485 A1    1/2018    Tanigawa et al.
(Continued)

FOREIGN PATENT DOCUMENTS

| JP | 5649773 | 1/2015 |
| JP | 2016-204639 | 12/2016 |

(Continued)

OTHER PUBLICATIONS

Official Communication issued in International Patent Application No. PCT/JP2019/009679, dated May 28, 2019, along with an English translation thereof.

*Primary Examiner* — Ian A Rummel
(74) *Attorney, Agent, or Firm* — Greenblum & Bernstein, P.L.C.

(57) ABSTRACT

A resin composition is provided and includes (A) a modified polyphenylene ether compound terminal-modified with a substituent having a carbon-carbon unsaturated double bond, (B) a maleimide compound containing no phenylmaleimide group and having a hydrocarbon group having 10 or more carbon atoms in the molecule thereof, and (C) at least one selected from a maleimide compound containing a phenylmaleimide group and a maleimide compound having an aliphatic hydrocarbon group having 9 or less carbon (Continued)

atoms in the molecule thereof, in which the content ratio of the component (A) to the component (B) is (A):(B)=20:80 to 90:10 in mass ratio.

13 Claims, 5 Drawing Sheets

(51) Int. Cl.
*B32B 15/08* (2006.01)
*H05K 1/05* (2006.01)

(56) References Cited

U.S. PATENT DOCUMENTS

| | | | |
|---|---|---|---|
| 2018/0258324 A1 | 9/2018 | Tochihira et al. | |
| 2019/0241729 A1* | 8/2019 | Tanigawa | H05K 1/03 |

FOREIGN PATENT DOCUMENTS

| | | |
|---|---|---|
| JP | 2017-206578 | 11/2017 |
| WO | 2014/181456 | 11/2014 |
| WO | 2016/117554 | 7/2016 |

* cited by examiner

RESIN COMPOSITION, AND PREPREG, RESIN-COATED FILM, RESIN-COATED METAL FOIL, METAL-CLAD LAMINATE, AND WIRING BOARD EACH OBTAINED USING SAID RESIN COMPOSITION

TECHNICAL FIELD

The present invention relates to a resin composition, and a prepreg, a film with resin, a metal foil with resin, a metal-clad laminate, and a wiring board each obtained using the resin composition.

BACKGROUND ART

In recent years, with increase in an amount of information processing, mounting technologies of various electronic devices, such as high integration of semiconductor devices to be mounted, high density of wiring, and multilayering are progressing rapidly. A substrate material for constituting a base material of a printed wiring board to be used in various electronic devices is required to have a low dielectric constant and a low dielectric loss tangent in order to increase signal transmission speed and to reduce loss during signal transmission.

Recently, it has been found that maleimide compounds are superior in dielectric properties such as a low dielectric constant and a low dielectric loss tangent (hereinafter, also referred to as low dielectric properties). For example, Patent Literature 1 reports that by using a curable resin composition containing a vinyl compound, an aromatic maleimide compound, and a styrene-based thermoplastic elastomer, a resin composition superior in curability in the presence of oxygen or at low temperatures as well as in properties, such as a low relative dielectric constant and a low dielectric loss tangent, can be obtained. However, although it is considered that the addition of the thermoplastic elastomer makes it possible to maintain the dielectric properties, it is easily imagined that heat resistance is deteriorated accordingly.

Further, Patent Literature 2 reports that by using a resin composition containing a maleimide compound having a saturated or unsaturated divalent hydrocarbon group and an aromatic maleimide compound, a resin composition having high-frequency properties (a low specific dielectric constant and a low dielectric loss tangent) in its cured product as well as a low thermal expansion property and adhesion can be provided.

Further, Patent Literature 3 discloses that an insulating composition containing a low molecular weight bismaleimide, a high molecular weight bismaleimide, and a curing agent (allylphenol or an amine compound) and being superior in heat resistance, flexibility, and voltage resistance can be obtained.

On the other hand, when the resin composition is used as a molding material such as a substrate material, not only it is required to be superior in low dielectric properties and low thermal expansion properties, but also its cured product is required to have a high glass transition temperature (Tg) or have heat resistance or adhesion in order to be hard to be affected by changes in the external environment. In addition, in order to use a wiring board even in an environment with high humidity, it is required that moisture absorption by the base material of the wiring board is suppressed by lowering the water absorption of the cured product of the molding material. Furthermore, it is required to improve handleability when the resin composition is used as a prepreg or a film.

As described above, the base material for forming the base material of a wiring board is required to be low in water absorption and superior in heat resistance and adhesion and affords a cured product having low dielectric properties, or a prepreg, a film with resin, or a metal foil with resin, and the like containing the resin composition or a semi-cured product thereof are required to be superior in handleability, etc.

However, the resin composition described in Patent Literature 2 is considered to afford low dielectric properties as well as heat resistance, adhesion, low thermal expansion properties, and a low water absorption rate up to a certain degree, whereas recently, substrate materials are required to be further improved at a higher level in performance such as a high Tg, heat resistance, adhesion, a low coefficient of thermal expansion, and a low water absorption rate in addition to low dielectric properties. It is considered to be necessary to increase the content of the aromatic maleimide compound in the resin composition described in Patent Literature 2 in order to improve the Tg of the resin composition, but doing so will cause the drawback that the water absorption rate increases.

In the resin composition described in Patent Literature 3, allylphenol or an amine compound is used as a curing agent, which may deteriorate the water absorption rate or the low dielectric properties. Further, Patent Literature 3 does not disclose the blending ratio of the high molecular weight bismaleimide to the curable polyphenylene ether, which is a crosslinking component, but depending on the blending ratio, the coefficient of thermal expansion and the Tg are expected to deteriorate. If a large amount of low molecular weight bismaleimide is added in order to suppress the deterioration, the Tg will increase, but the water absorption rate may also increase.

The present invention has been devised in view of such circumstances, and an object thereof is to provide a resin composition having a handleability in a prepreg, a film with resin, a metal foil with resin, etc. containing a resin composition or a semi-cured product thereof, as well as low dielectric properties, high heat resistance, a high Tg, a low coefficient of thermal expansion, adhesion, and a low water absorption property of a cured product of the resin composition. Another object is to provide a prepreg, a film with resin, a metal foil with resin, a metal-clad laminate, and a wiring board each obtained using the resin composition.

CITATION LIST

Patent Literature

Patent Literature 1: JP 5649773 B2
Patent Literature 2: JP 2016-204639 A
Patent Literature 3: WO 2014/181456 A1

SUMMARY OF INVENTION

The resin composition according to one embodiment of the present invention is characterized by comprising (A) a modified polyphenylene ether compound terminal-modified with a substituent having a carbon-carbon unsaturated double bond, (B) a maleimide compound containing no phenylmaleimide group and having a hydrocarbon group having 10 or more carbon atoms in a molecule thereof, and (C) at least one selected from a maleimide compound containing a phenylmaleimide group and a maleimide compound having an aliphatic hydrocarbon group having 9 or less carbon atoms in a molecule thereof, in which a content ratio of the component (A) to the component (B) is (A):(B)=20:80 to 90:10 in mass ratio.

DESCRIPTION OF EMBODIMENTS

Figure 1:
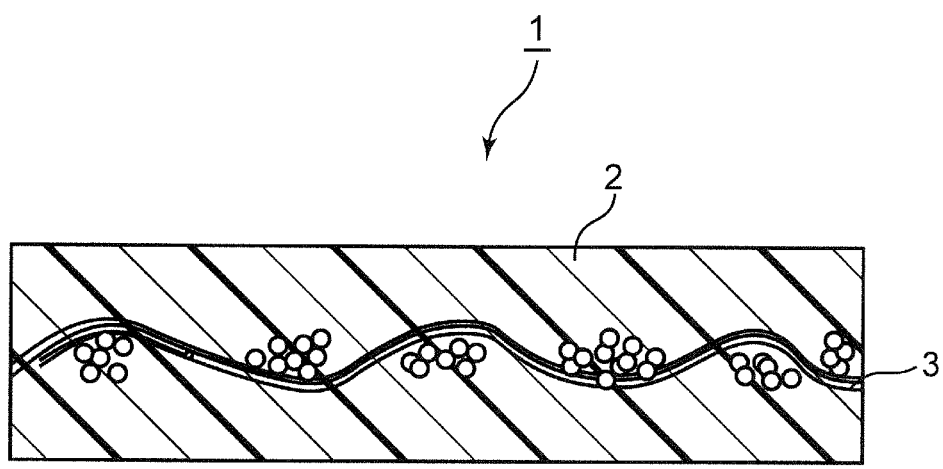
FIG. 1 is a schematic cross-sectional view showing the configuration of a prepreg according to an embodiment of the present invention.

The resin composition according to an embodiment of the present invention is characterized by comprising (A) a modified polyphenylene ether compound terminal-modified with a substituent having a carbon-carbon unsaturated double bond, (B) a maleimide compound containing no phenylmaleimide group and having a hydrocarbon group having 10 or more carbon atoms in a molecule thereof, and (C) at least one selected from a maleimide compound containing a phenylmaleimide group and a maleimide compound having an aliphatic hydrocarbon group having 9 or less carbon atoms in a molecule thereof, in which a content ratio of the component (A) to the component (B) is (A):(B)=20:80 to 90:10 in mass ratio.

According to such a configuration, it is possible to provide a resin composition having a handleability in a prepreg, a film with resin, a metal foil with resin, etc. containing a resin composition or a semi-cured product thereof, as well as low dielectric properties, a high heat resistance, a high glass transition temperature (Tg), a low coefficient of thermal expansion, adhesion, and a low water absorption property of a cured product of the resin composition. Furthermore, according to the present invention, it is possible to provide a prepreg, a film with resin, a metal foil with resin, a metal-clad laminate, and a wiring board each having excellent performance by using the resin composition.

Hereinafter, each component of the resin composition according to this embodiment will be specifically described.

((A) Modified Polyphenylene Ether Compound)

The modified polyphenylene ether compound (A) to be used in this embodiment is not particularly limited as long as it is a modified polyphenylene ether compound terminal-modified with a substituent having a carbon-carbon unsaturated double bond. It is considered that by containing such a modified polyphenylene ether compound, it is possible to combine both dielectric properties such as a low dielectric constant and a low dielectric loss tangent and high heat resistance.

Specific examples of the modified polyphenylene ether compound include modified polyphenylene ether compounds represented by the following formulas (1) to (3).

[Chemical Formula 1]

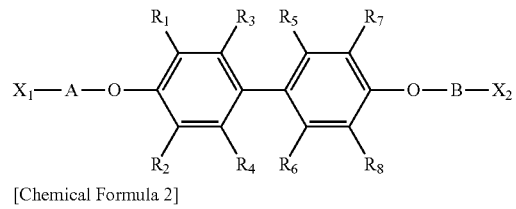

(1)

[Chemical Formula 2]

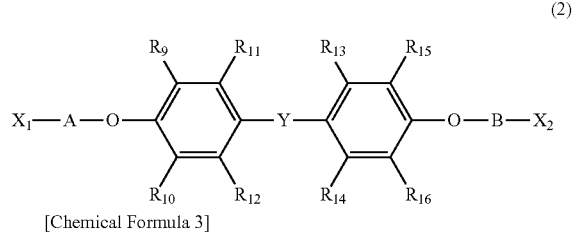

(2)

[Chemical Formula 3]

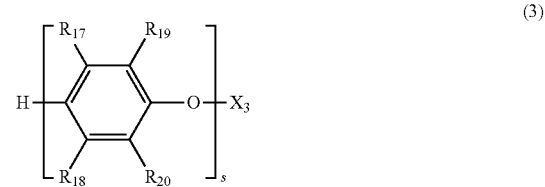

(3)

In the above formulas (1) to (3), $R_1$ to $R_8$, $R_9$ to $R_{16}$ and $R_{17}$ to $R_{20}$ are each independent. That is, $R_1$ to $R_8$, $R_9$ to $R_{16}$ and $R_{17}$ to $R_{20}$ may be either the same group or different groups. $R_1$ to $R_8$, $R_9$ to $R_{16}$ and $R_{17}$ to $R_{20}$ represent a hydrogen atom, an alkyl group, an alkenyl group, an alkynyl group, a formyl group, an alkylcarbonyl group, an alkenylcarbonyl group, or an alkynylcarbonyl group. Among them, a hydrogen atom and an alkyl group are preferable.

Regarding $R_1$ to $R_8$, $R_9$ to $R_{16}$ and $R_{17}$ to $R_{20}$, specific examples of the functional groups mentioned above are as follows.

The alkyl group is not particularly limited, and is preferably an alkyl group having 1 to 18 carbon atoms, and more preferably an alkyl group having 1 to 10 carbon atoms. Specific examples of the alkyl group include a methyl group, an ethyl group, a propyl group, a hexyl group, and a decyl group.

The alkenyl group is not particularly limited, and is preferably an alkenyl group having 2 to 18 carbon atoms, more preferably an alkenyl group having 2 to 10 carbon atoms. Specific examples of the alkenyl group include a vinyl group, an allyl group, and a 3-butenyl group.

The alkynyl group is not particularly limited, and is preferably an alkynyl group having 2 to 18 carbon atoms, more preferably an alkynyl group having 2 to 10 carbon atoms. Specific examples of the alkynyl group include an ethynyl group and a prop-2-yn-1-yl group (a propargyl group).

The alkylcarbonyl group is not particularly limited as long as it is a carbonyl group substituted with an alkyl group, and is preferably an alkylcarbonyl group having 2 to 18 carbon atoms, more preferably an alkylcarbonyl group having 2 to 10 carbon atoms. Specific examples of the alkylcarbonyl group include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group, and is preferably an alkenylcarbonyl group having 3 to 18 carbon atoms, more preferably an alkenylcarbonyl group having 3 to 10 carbon atoms. Specific examples of the alkenylcarbonyl group include an acryloyl group, a methacryloyl group, and a crotonoyl group.

The alkynylcarbonyl group is not particularly limited as long as it is a carbonyl group substituted with an alkynyl group, and is preferably an alkynylcarbonyl group having 3 to 18 carbon atoms, more preferably an alkynylcarbonyl group having 3 to 10 carbon atoms. Specific examples of the alkynylcarbonyl group include a propioloyl group.

In the above formulas (1) and (2), as described above, A is a structure represented by the following formula (4), and B is a structure represented by the following formula (5).

[Chemical Formula 4]

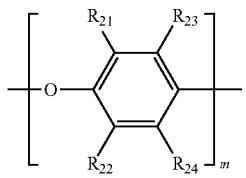

(4)

[Chemical Formula 5]

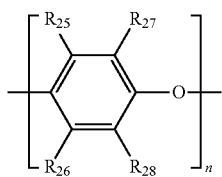

(5)

In the formulas (4) and (5), the repeating units m and n each represent an integer of 1 to 50.

$R_{21}$ to $R_{24}$ and $R_{25}$ to $R_{28}$ are each independent. That is, $R_{21}$ to $R_{24}$ and $R_{25}$ to $R_{28}$ may be either the same group or different groups. In this embodiment, $R_{21}$ to $R_{24}$ and $R_{25}$ to $R_{28}$ are hydrogen atoms or alkyl groups.

In the above formula (3), s represents an integer of 1 to 100.

Further, in the above formula (2), examples of Y include linear, branched or cyclic hydrocarbons having 20 or less carbon atoms. More specifically, Y is a structure represented by the following formula (6), for example.

[Chemical Formula 6]

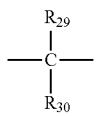

(6)

In the formula (6), $R_{29}$ and $R_{30}$ each independently represent a hydrogen atom or an alkyl group. Examples of the alkyl group include a methyl group. Examples of the group represented by the formula (6) include a methylene group, a methylmethylene group, and a dimethylmethylene group.

In the above formulas (1) to (3), it is preferable that $X_1$ to $X_3$ are each independently a substituent having a carbon-carbon unsaturated double bond represented by the following formula (7) or (8). $X_1$ and $X_2$ may be either the same or different.

[Chemical Formula 7]

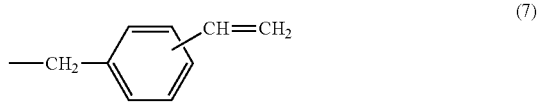

(7)

[Chemical Formula 8]

(8)

In the formula (8), $R_{31}$ represents a hydrogen atom or an alkyl group. The alkyl group is not particularly limited, and is preferably an alkyl group having 1 to 18 carbon atoms, and more preferably an alkyl group having 1 to 10 carbon atoms. Specific examples of the alkyl group include a methyl group, an ethyl group, a propyl group, a hexyl group, and a decyl group.

More specific examples of the substituents $X_1$ to $X_3$ in this embodiment include vinylbenzyl groups (ethynylbenzyl group) such as a p-ethenylbenzyl group and a m-ethenylbenzyl group, a vinylphenyl group, an acrylate group, and a methacrylate group.

Use of such modified polyphenylene ether compounds represented by the above formulas (1) to (3) is considered to achieve superior heat resistance as well as low dielectric properties, such as a low dielectric constant or a low dielectric loss tangent, and combine a high Tg with adhesion.

The modified polyphenylene ether compounds represented by the above formulas (1) to (3) each may be used singly or in combination of two or more thereof.

In this embodiment, the weight average molecular weight (Mw) of the modified polyphenylene ether compound is not particularly limited, and, for example, is preferably 1000 to 5000, more preferably 1000 to 4000. The weight average molecular weight may be measured by a common molecular weight measurement method, and the weight average molecular weight may specifically be a value measured by gel permeation chromatography (GP) or the like. When the modified polyphenylene ether compound has repeating units (s, m, n) in the molecule thereof, these repeating units are preferably numerical values such that the weight average molecular weight of the modified polyphenylene ether compound falls within the above range.

When the weight average molecular weight of the modified polyphenylene ether compound is in the above range, the resin composition has superior low dielectric properties inherently possessed by polyphenylene ether, and provides a cured product superior in moldability as well as in heat resistance. The reason for this is considered to be as follows. A common polyphenylene ether has a relatively low molecular weight when its weight average molecular weight is in the above range. As a result, a cured product tends to have reduced heat resistance. In this respect, since the modified polyphenylene ether compound according to this embodiment has an unsaturated double bond at its terminal, it is thought that a cured product having sufficiently high heat resistance can be obtained. Furthermore, when the weight average molecular weight of the modified polyphenylene ether compound is in the above range, the modified polyphenylene ether compound is considered to have a relatively low molecular weight, so that the cured product is low in melt viscosity and superior in moldability. Therefore, it is considered that such a modified polyphenylene ether compound gives a cured product superior not only in heat resistance but also in moldability or appearance.

The average number of the substituents at the molecular terminal (the number of terminal functional groups) per molecule of modified polyphenylene ether in the modified polyphenylene ether compound to be used in this embodiment is not particularly limited. Specifically, the average number is preferably 1 to 5, more preferably 1 to 3. When the number of terminal functional groups is excessively small, the cured product tends to have insufficient heat resistance. On the other hand, when the number of terminal functional groups is excessively large, the reactivity becomes excessively high, so that disadvantages such as decrease in storage stability or fluidity of the resin composition may arise. Thus, when such a modified polyphenylene ether with insufficient fluidity is used, for example, molding defects such as generation of voids due to insufficient fluidity or the like at the time of multilayer molding occurred, and a molding problem such that it is difficult to obtain a highly reliable printed wiring board may occur.

The number of terminal functional groups of the modified polyphenylene ether compound is a numerical value representing an average value of the substituents per molecule of all the modified polyphenylene ether compounds present in 1 mole of the modified polyphenylene ether compound. The number of terminal functional groups can be determined by, for example, measuring the number of hydroxyl groups remaining in the obtained modified polyphenylene ether compound and then calculating the decrease from the number of hydroxyl groups of the polyphenylene ether before modification. The decrease from the number of hydroxy groups of the polyphenylene ether before modification is the number of terminal functional groups. The number of hydroxyl groups remaining in the modified polyphenylene ether compound can be determined by adding a quaternary ammonium salt (tetraethylammonium hydroxide), which is to be associated with a hydroxyl group, to a solution of the modified polyphenylene ether compound, and measuring the UV absorbance of the mixed solution.

The intrinsic viscosity of the modified polyphenylene ether compound to be used in this embodiment is not particularly limited. Specifically, the intrinsic viscosity is preferably 0.03 to 0.12 dl/g, more preferably 0.04 to 0.11 dlg, still more preferably 0.06 to 0.095 dl/g. When the intrinsic viscosity is excessively low, the molecular weight tends to be low, making it unlikely to obtain low dielectric properties such as a low dielectric constant and a low dielectric loss tangent. On the other hand, when the intrinsic viscosity is excessively high, the viscosity tends to be high, resulting in failure to obtain a sufficient fluidity of the modified polyphenylene ether compound. Thus, the moldability of the cured product tends to decrease. Therefore, when the modified polyphenylene ether compound has an intrinsic viscosity in the above range, superior heat resistance and moldability of the cured product can be realized.

The intrinsic viscosity mentioned herein is measured in a methylene chloride at 25° C. More specifically, the intrinsic viscosity is measured, for example, in 0.18 g/45 ml of methylene chloride solution (solution temperature: 25° C.) using a viscometer. Examples of the viscometer include Visco System AVS 500 available from Schott.

The method for synthesizing the modified polyphenylene ether compound to be preferably used in this embodiment is not particularly limited as long as a modified polyphenylene ether compound that is terminal-modified with the substituents $X_1$ to $X_3$ described above can be synthesized. Specific examples thereof include a method where a polyphenylene ether is caused to react with a compound to which substituents $X_1$ to $X_3$ and a halogen atom are bonded.

The polyphenylene ether as a raw material is not particularly limited as long as it can finally synthesize a prescribed modified polyphenylene ether compound. Specific examples thereof include those containing polyphenylene ether as a main component, such as a polyphenylene ether composed of 2,6-dimethylphenol and at least one of a bifunctional phenol and a trifunctional phenol, and poly(2,6-dimethyl-1,4-phenylene oxide). The bifunctional phenol is a phenol compound having two phenolic hydroxyl groups in the molecule thereof, and examples thereof include tetramethyl biphenol A. The trifunctional phenol is a phenol compound having three phenolic hydroxyl groups in the molecule thereof.

As one example of a method for synthesizing a modified polyphenylene ether compound, for example, in the case of a modified polyphenylene ether compound as represented by the above formula (2), specifically, the polyphenylene ether as described above and a compound to which substituents $X_1$ and $X_2$ and a halogen atom are bonded (a compound having substituents $X_1$ and $X_2$) are dissolved in a solvent and then stirred. By doing so, the polyphenylene ether reacts with the compound having the substituents $X_1$ and $X_2$ to obtain the modified polyphenylene ether represented by the above formula (2) of this embodiment.

Preferably, the reaction is carried out in the presence of an alkali metal hydroxide. By doing so, this reaction is considered to proceed favorably. This is considered to be due to the fact that the alkali metal hydroxide functions as a dehydrohalogenating agent, specifically as a dehydrochlorinating agent. That is, the alkali metal hydroxide eliminates hydrogen halide from the phenol group of the polyphenylene ether and the compound having the substituent X, so that the substituents $X_1$ and $X_2$ are considered to be bonded to the oxygen atom of the phenol group in place of the hydrogen atom of the phenol group of the polyphenylene ether.

The alkali metal hydroxide is not particularly limited as long as it can function as a dehalogenating agent, and examples thereof include sodium hydroxide. The alkali metal hydroxide is usually used in the form of an aqueous solution, specifically, in the form of an aqueous solution of sodium hydroxide.

The reaction conditions such as the reaction time and the reaction temperature vary depending on the compound having the substituents $X_1$ and $X_2$, etc., and are not particularly limited as long as the reaction proceeds favorably. Specifically, the reaction temperature is preferably room temperature to 100° C., more preferably 30 to 100° C. The reaction time is preferably 0.5 to 20 hours, more preferably 0.5 to 10 hours.

The solvent to be used at the time of the reaction is not particularly limited as long as it can dissolve the polyphenylene ether and the compound having the substituents $X_1$ and $X_2$ and does not inhibit the reaction between the polyphenylene ether and the compound having the substituents $X_1$ and $X_2$. Specific examples of the solvent include toluene.

The reaction described above is preferably performed in the presence of not only an alkali metal hydroxide but also a phase-transfer catalyst. That is, it is preferable to perform the reaction in the presence of an alkali metal hydroxide and a phase-transfer catalyst. By doing so, the reaction is considered to proceed more favorably. The reason for this is considered to be as follows. Such a favorable reaction is considered to be due to that the phase-transfer catalyst is a catalyst that has a function of incorporating an alkali metal hydroxide, is soluble both in a polar solvent phase such as water and in a nonpolar solvent phase such as an organic solvent, and is capable of moving between these phases. Specifically, in the case where an aqueous solution of sodium hydroxide is used as the alkali metal hydroxide, and an organic solvent such as toluene, which is incompatible with water, is used as the solvent, it is considered that the solvent and the aqueous solution of sodium hydroxide are separated even if the aqueous solution of sodium hydroxide is added dropwise to the solvent in use in the reaction, so that sodium hydroxide is difficult to transfer to the solvent. Consequently, it is considered that the aqueous solution of sodium hydroxide added as the alkali metal hydroxide does not sufficiently contribute to promotion of the reaction. In contrast, when the reaction is carried out in the presence of an alkali metal hydroxide and a phase-transfer catalyst, it is considered that the alkali metal hydroxide is transferred to the solvent in a state where the alkali metal hydroxide is incorporated in the phase-transfer catalyst, and thus the aqueous solution of sodium hydroxide becomes likely to contribute to promotion of the reaction. For this reason, this is considered that the reaction proceeds more favorably in the presence of the alkali metal hydroxide and the phase-transfer catalyst.

The phase-transfer catalyst is not particularly limited, and examples thereof include a quaternary ammonium salt such as tetra-n-butylammonium bromide.

It is preferable that the resin composition according to this embodiment contains the modified polyphenylene ether obtained as described above as the modified polyphenylene ether.

((B) Maleimide Compound)

Next, the component (B) to be used in this embodiment, that is, the maleimide compound containing no phenylmaleimide group and having a hydrocarbon group having 10 or more carbon atoms in the molecule thereof will be described. The maleimide compound (B) to be used in this embodiment is not particularly limited as long as it is a maleimide compound containing no phenylmaleimide group and having a hydrocarbon group having 10 or more carbon atoms in the molecule thereof. It is considered that thanks to containing such a maleimide compound, the flexibility of the resin is improved, the handleability (powder falling, etc.) of the resin composition when it is brought into a semi-cured state is improved, and the toughness is also increased, so that high adhesion is also obtained. Further, since the hydrocarbon group is nonpolar, there is an advantage that the water absorption rate can be lowered while maintaining the low dielectric properties.

The number of the carbon atoms of the hydrocarbon group is not particularly limited as long as it is 10 or more, and it is preferably 20 or more, and more preferably 30 or more. When the number of the carbon atoms of the hydrocarbon group is in such a range, it is considered that high adhesion, low dielectric properties and a low water absorption rate can be obtained more certainly. It is desirable that such a hydrocarbon group be an aliphatic hydrocarbon group having a lower polarity. Such an aliphatic hydrocarbon group may be linear such as an alkylene group or may contain an alicyclic hydrocarbon structure such as cycloalkane. The linear or cyclic aliphatic hydrocarbon group may contain a branched structure made up of an aliphatic hydrocarbon group such as an alkyl group in the molecule thereof. More specifically, preferable examples of the maleimide compound as described above include maleimide compounds represented by the following formulas (9) to (12). These may be used either singly or in combination of two or more thereof. Since such a maleimide compound reacts efficiently with the component (A) because of having a maleimide group at a terminal, the interface adhesion between the component (A) and the component (B) of this embodiment is improved, so that high heat resistance and reliability are obtained.

[Chemical Formula 9]

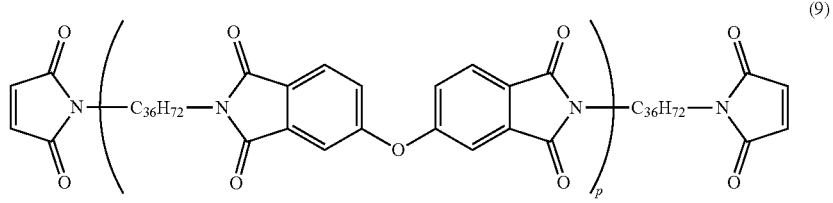

(9)

In the formula (9), p, which is a repeating unit, is 1 to 10. When p is in the range of 1 to 10, the fluidity of the resin is high, so that the moldability is good.

[Chemical Formula 10]

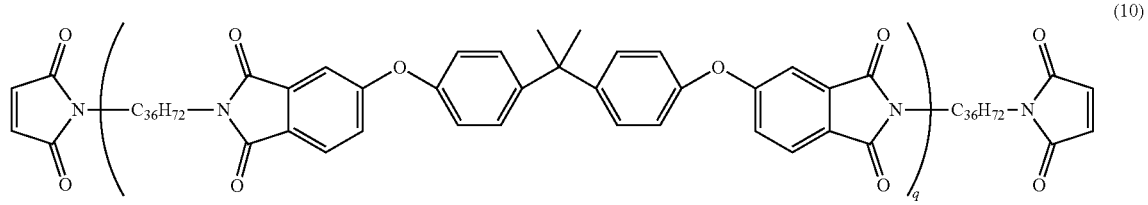

(10)

In the formula (10), q, which is a repeating unit, is 1 to 10. When q is in the range of 1 to 10, the fluidity of the resin is high, so that the moldability is good.

[Chemical Formula 11]

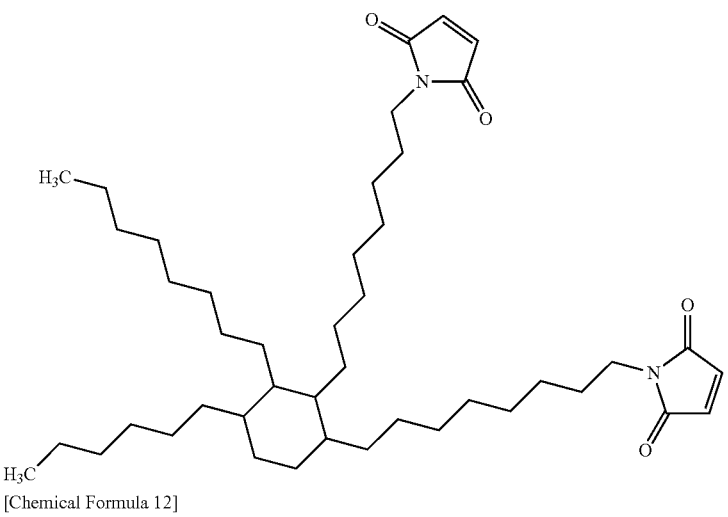

(11)

[Chemical Formula 12]

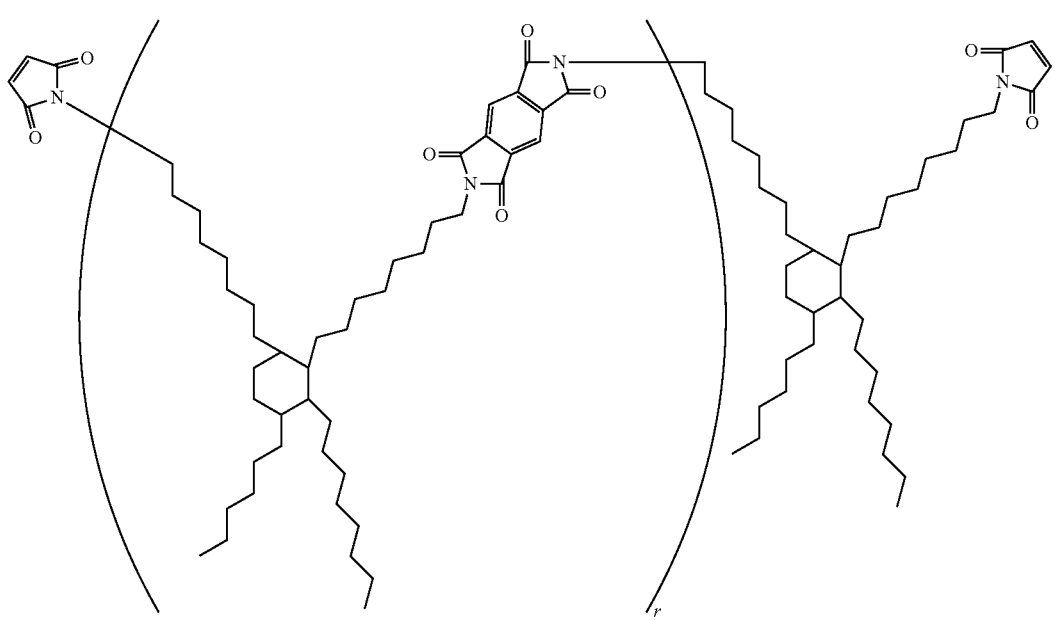

(12)

In the formula (12), r, which is a repeating unit, is 1 to 10. When r is in the range of 1 to 10, the fluidity of the resin is high, so that the moldability is good.

The maleimide compound to be used in this embodiment preferably has a weight average molecular weight (Mw) of 500 to 4000. It is considered when the weight average molecular weight of the maleimide compound is 500 or more, a more reduced dielectric property is obtained, whereas it is considered that when the weight average molecular weight is 4000 or less, the resin has a more reduced melt viscosity, so that more improved moldability can be obtained. The weight average molecular weight may be measured by a common molecular weight measurement method, and the weight average molecular weight may specifically be a value measured by gel permeation chromatography (GPC) or the like.

((C) Maleimide Compound)

Next, the component (C) to be used in this embodiment, namely, a maleimide compound that is at least one selected from a maleimide compound containing a phenylmaleimide group and a maleimide compound having an aliphatic hydrocarbon group having 9 or less carbon atoms in the molecule thereof, will be described. The maleimide compound (C) to be used in this embodiment is a maleimide compound other than the maleimide compound of the component (B). That is, the maleimide compound (C) is not particularly limited as long as it is at least one selected from a maleimide compound containing a phenylmaleimide group and a maleimide compound having an aliphatic hydrocarbon group having 9 or less carbon atoms in the molecule thereof.

The condition of containing such a maleimide compound (C) affords the advantages that the resin composition has a low coefficient of thermal expansion, high heat resistance, and a high Tg more certainly and low dielectric properties are not deteriorated.

Specific examples of the maleimide compound containing a phenylmaleimide group include 4,4'-diphenylmethane bismaleimide, polyphenylmethane maleimide, m-phenylene bismaleimide, bisphenol A diphenyl ether bismaleimide, 3,3'-dimethyl-5,5'-diethyl-4,4'-diphenylmethane bismaleimide, and 4-methyl-1,3-phenylene bismaleimide.

A biphenylaralkyl-type polymaleimide compound having the following structure can also be used.

[Chemical Formula 13]

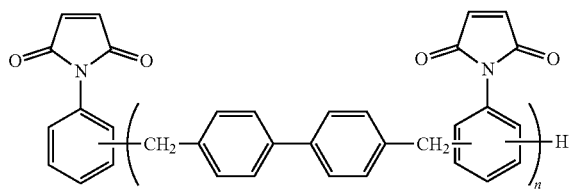

In the formula, n is an average value and represents n=0.5 to 5.

As such a maleimide compound, a commercially available product may be used, and for example, BMI-4000, BMI-2300 manufactured by Daiwa Kasei Industry Co., Ltd., or MIR-3000 manufactured by Nippon Kayaku Co., Ltd. may be used.

Examples of the maleimide compound having a hydrocarbon group having 9 or less carbon atoms in 1,2-dimaleimidoethane, 1,3-dimaleimidopropane, and 1,6-bismaleimide-(2,2,4-trimethyl)hexane.

As such a maleimide compound, a commercially available product may be used, and for example, BMI-TMH manufactured by Daiwa Kasei Industry Co., Ltd. may be used.

The functional group equivalent of the maleimide group of the maleimide compound (C) is not particularly limited, and is preferably 150 to 500 g/eq, more preferably 230 to 400 g/eq. It is considered that when the functional group equivalent is in such a range, the Tg of the cured product can be increased and the water absorption rate can be reduced more certainly.

The weight average molecular weight of the maleimide compound (C) is not particularly limited, and is desirably 1000 or less. It is considered that the Tg of the cured product can be increased by using a relatively low molecular weight compound.

The content of the maleimide compound (C) is preferably 5 to 50 parts by mass per 100 parts by mass of the total of the components (A), (B) and (C). It is considered that when containing the maleimide compound (C) in such a range, both a low water absorption rate and a high Tg can be achieved more certainly.

(Content Ratio of (A) to (B))

In the resin composition of this embodiment, the content ratio of the component (A) to the component (B) is 20:80 to 90:10 in mass ratio. If the content ratio of the (A) component is less than this, the coefficient of thermal expansion increases because the reactivity with the component (B) and the component (C) decreases, and sufficient adhesion and a high Tg may not be obtained. On the other hand, when the content ratio of the component (B) is less than this, the handleability is poor when the resin composition is formed into a prepreg or a film.

A more preferable range of the content ratio is the component (A):the component (B)=20:80 to 70:30.

(Content Ratio of (B) to (C))

In the resin composition of this embodiment, the content ratio of the component (B) to the component (C) is preferably 87:13 to 15:85 in mass ratio. If the content ratio of the component (B) is less than this, the low dielectric properties and the water absorption rate may deteriorate. On the other hand, if the content ratio of the component (C) is less than this, the coefficient of thermal expansion may increase.

A more preferable range of the content ratio is the component (B):the component (C)=85:15 to 30:70, and an even more preferable range is 85:15 to 50:50.

(Other Components)

Further, the resin composition according to this embodiment may further contain other components in addition to the modified polyphenylene ether compound (A), the maleimide compound (B), and the maleimide compound (C).

For example, the resin composition according to this embodiment may further contain a filler. Examples of the filler include those to be added to enhance the heat resistance and flame retardancy of the cured product of the resin composition, and such fillers are not particularly limited. Further, by including the filler, the heat resistance and the flame retardancy can be further enhanced. Specific examples of the filler include silica such as spherical silica, metal oxides such as alumina, titanium oxide, and mica, metal hydroxides such as aluminum hydroxide and magnesium hydroxide, talc, aluminum borate, barium sulfate, and calcium carbonate. Among them, the filler is preferably silica, mica, or talc, more preferably spherical silica. The fillers may be used either singly or in combination of two or more thereof. The filler may be used as it is, or may be used after being subjected to surface treatment with a silane coupling agent of epoxysilane type, vinylsilane type, methacrylsilane type, or aminosilane type. The silane coupling agent may be added by an integral blending method instead of the preceding surface treatment of the filler.

When the filler is contained, its content is preferably 10 to 200 parts by mass, more preferably 30 to 150 parts by mass per 100 parts by mass of the total of the organic components (the component (A) and the component (B)).

Further, the resin composition of this embodiment may contain a flame retardant, and examples of the flame retardant include halogen-based flame retardants such as bromine-based flame retardants, and phosphorus-based flame retardants. Specific examples of the halogen-based flame retardant include bromine-based flame retardants such as pentabromodiphenyl ether, octabromodiphenyl ether, decabromodiphenyl ether, tetrabromobisphenol A, and hexabromocyclododecane, and chlorine-based flame retardants such as chlorinated paraffin. Specific examples of the phosphorus-based flame retardant include phosphoric acid esters such as condensed phosphoric acid esters and cyclic phosphoric acid esters, phosphazene compounds such as cyclic phosphazene compounds, phosphinate-based flame retardants such as metal phosphinates such as aluminum dialkylphosphinate, melamine-based flame retardants such as melamine phosphate and melamine polyphosphate, and phosphine oxide compounds having a diphenylphosphine oxide group. As the flame retardant, the flame retardants mentioned above as examples may be used either singly or in combination of two or more species.

Further, the resin composition according to this embodiment may contain various additives other than the above. Examples of the additives include antifoaming agents such as silicone-based antifoaming agents and acrylic acid ester-based antifoaming agents, heat stabilizers, antistatic agents, ultraviolet absorbers, dyes, pigments, lubricants, and wet dispersants.

The resin composition according to this embodiment may further contain a reaction initiator. Even if the resin composition contains only the component (A), the component (B), and the component (C), the curing reaction can proceed, but depending on process conditions, it may be difficult to increase the temperature until curing proceeds, so that a reaction initiator may be added. The reaction initiator is not particularly limited as long as it can promote the curing reaction between the modified polyphenylene ether compound and the maleimide compound.

Specific examples thereof include oxidants such as α,α'-bis(t-butylperoxy-m-isopropyl)benzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile. If necessary, a carboxylic acid metal salt or the like may be used in combination. By doing so, the curing reaction can be further promoted. Among them, α,α'-bis(t-butylperoxy-m-isopropyl)benzene is preferably used. Since α,α'-bis(t-butylperoxy-m-isopropyl)benzene has a relatively high reaction initiation temperature, it is possible to suppress the promotion of the curing reaction at the time when it is not necessary to perform the curing, such as during drying of prepreg, as well as to suppress the deterioration of the storage stability of the resin composition. In addition, since α,α'-bis(t-butylperoxy-m-isopropyl) benzene has low volatility, it is not volatilized during drying or preservation of a prepreg, a film, or the like, and has good stability. Reaction initiators may be used singly or in combination of two or more thereof. Regarding the content, a reaction initiator is preferably used such that the added amount thereof is 0.1 to 2 parts by mass per 100 parts by mass of the total of the components (A), (B), and (C).

(Prepreg, Film with Resin, Metal-Clad Laminate, Wiring Board, and Metal Foil with Resin)

Next, a prepreg, a metal-clad laminate, a wiring board, and a metal foil with resin using the resin composition of this embodiment will be described.

FIG. 1 is a schematic sectional view showing one example of a prepreg 1 according to the embodiment of the present invention. The symbols in each drawing indicate the following: 1 prepreg, 2 resin composition or semi-cured product of resin composition, 3 fibrous base material, 11 metal-clad laminate, 12 insulating layer, 13 metal foil, 14 wiring, 21 wiring board, 31 metal foil with resin, 32, 42 resin layer, 41 film with resin, 43 support film.

As shown in FIG. 1, the prepreg 1 according to this embodiment includes a resin composition or a semi-cured product of a resin composition 2, and a fibrous base material 3. Examples of the prepreg 1 include those in which the fibrous base material 3 is present in the resin composition or a semi-cured product 2 thereof. That is, the prepreg 1 includes the resin composition or a semi-cured product 2 thereof and the fibrous base material 3 present in the resin composition or in the semi-cured product 2 thereof.

In addition, in this embodiment, the "semi-cured product" is a resin composition partially cured to such an extent that the resin composition can be further cured. That is, a semi-cured product is a resin composition in a state where it is semi-cured (B-staged). For example, when being heated, a resin composition gradually decreases in viscosity, then starts to be cured and gradually increases in viscosity. In such a case, the semi-curing may be a state between the beginning of the viscosity rise and before the complete curing. In the prepreg, the metal foil with a resin, and the film with a resin of this embodiment described below, the resin composition or a semi-cured product of the resin composition may be dried or heat dried.

The prepreg obtained by using the resin composition according to this embodiment may be a prepreg including a semi-cured product of the resin composition as described above or may be a prepreg including the resin composition before curing. That is, the prepreg may be a prepreg including a semi-cured product of the resin composition (the resin composition in B stage) and a fibrous base material, or may be a prepreg including the resin composition before curing (the resin composition in A stage) and a fibrous base material. Specific examples include those including a fibrous base material present in the resin composition.

The resin composition according to this embodiment is often used as a resin varnish prepared in the form of a varnish when producing the prepreg described above or a metal foil with a resin such as RCC described later or a metal-clad laminate. Such a resin varnish is prepared, for example, as follows First, each component that is soluble in an organic solvent, such as a modified polyphenylene ether compound (A), a maleimide compound (B), a maleimide compound (C), and a reaction initiator, is put into an organic solvent and then dissolved. At this time, heating may be performed as necessary. Then, components insoluble in an organic solvent, such as an inorganic filler, are added, and then are dispersed using a ball mill, a bead mill, a planetary mixer, a roll mill or the like until a prescribed dispersion state is reached, whereby a varnish-like resin composition is prepared. The organic solvent to be used herein is not particularly limited as long as it dissolves the modified polyphenylene ether compound (A), the maleimide compound (B), the maleimide compound (C), etc. and does not inhibit the curing reaction. Specific examples thereof include toluene, methyl ethyl ketone, cyclohexanone, and propylene glycol monomethyl ether acetate. These may be used either singly or in combination of two or more thereof.

The resin varnish of this embodiment has advantages of being superior in film flexibility, film-forming property, and impregnation property into glass cloth, and being easy to handle.

Examples of a method for producing the prepreg 1 of this embodiment using the obtained resin varnish includes a method in which the fibrous base material 3 is impregnated with the obtained resin composition 2 prepared in a resin varnish state, and then dried.

Specific examples of the fibrous base material to be used in producing the prepreg include glass cloth, aramid cloth, polyester cloth, LCP (liquid crystal polymer) nonwoven fabric, glass nonwoven fabric, aramid nonwoven fabric, polyester nonwoven fabric, pulp paper, and linter paper. When a glass cloth is used, a laminated board having superior mechanical strength is obtained, and a glass cloth subjected to flattening process is particularly preferable. The glass cloth used in this embodiment is not particularly limited, but examples thereof include low dielectric constant glass cloth such as E glass, S glass, NE glass and L glass. Specifically, the flattening process can be performed, for example, by continuously pressing the glass cloth with a press roll at an appropriate pressure to flatten the yarn.

Commonly, the thickness of the fibrous base material to be used is, for example, 0.01 to 0.3 mm.

The fibrous base material 3 is impregnated with the resin varnish (the resin composition 2) by immersion, coating, or the like. This impregnation may be repeated a plurality of times as necessary. At this time, it is also possible to finally adjust the desired composition (content ratio) and resin amount by repeating impregnation using a plurality of resin varnishes differing in composition or concentration.

The fibrous base material 3 impregnated with the resin varnish (the resin composition 2) is heated at desired heating conditions, for example, 80° C. or more and 180° C. or less for 1 minute or more and 10 minutes or less. By heating, the solvent is reduced or removed by volatilizing it from the varnish, and the prepreg 1 before curing (A stage) or in a semi-cured state (B stage) is obtained.

Figure 4:
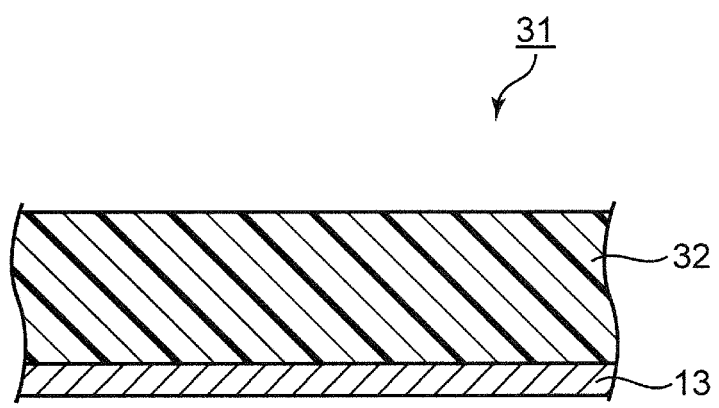
FIG. 4 is a schematic cross-sectional view showing the configuration of a metal foil with resin according to the embodiment of the present invention.

As shown in FIG. 4, the metal foil with a resin 31 of this embodiment has a configuration in which a resin layer 32 containing the above-described resin composition or a semi-cured product of the resin composition and a metal foil 13 are laminated. Examples of a method for producing such a metal foil with a resin 31 include a method in which the resin varnish-like resin composition as described above is applied to the surface of the metal foil 13 such as a copper foil and then dried. Examples of the application method include a bar coater, a comma coater, a die coater, a roll coater, and a gravure coater.

Figure 5:
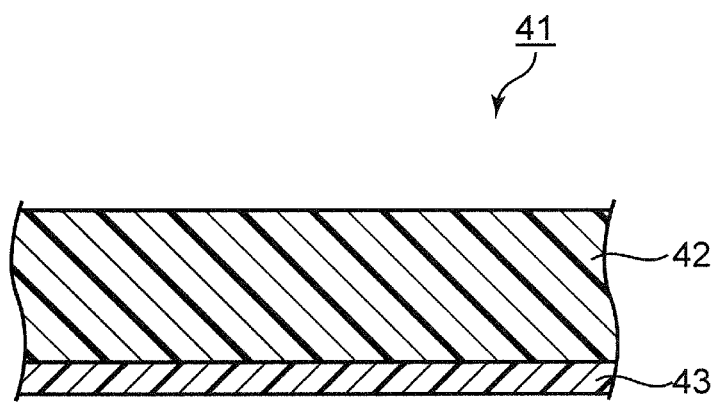
FIG. 5 is a schematic cross-sectional view showing the configuration of a resin film according to the embodiment of the present invention.

As shown in FIG. 5, the film with resin 41 of this embodiment has a configuration in which a resin layer 42 containing the resin composition described above or a semi-cured product of the resin composition and a film support base material 43 are laminated. Examples of a method for producing such a film with resin 41 include a method in which the resin varnish-like resin composition as described above is applied to the surface of the film support base material 43 and then cured or semi-cured by drying or the like. Examples of the film support base material include electrically insulating film such as polyimide film, PET (polyethylene terephthalate) film, polyester film, polyparabanic acid film, polyether ether ketone film, polyphenylene sulfide film, aramid film, polycarbonate film, and polyarylate film.

As the metal foil 13, metal foils to be used in metal-clad laminates, wiring boards, etc. can be used without limitations, and examples thereof include copper foil and aluminum foil.

The thickness, etc. of the metal foil 13 and the film support base material 43 may be appropriately set according to the desired purpose. For example, the metal foil 13 to be used may have a thickness of about 0.2 to 70 μm. When the thickness of the metal foil is, for example, 10 μm or less, a copper foil with a carrier provided with a release layer and a carrier for improving the handleability may be used. The application of the resin varnish to the metal foil 13 or the film support base material 43 is performed by coating or the like, and the application may be repeated a plurality of times as necessary. At this time, it is also possible to finally adjust the desired composition (content ratio) and resin amount by repeating the coating using a plurality of resin varnishes differing in composition or concentration.

When the resin varnish-like resin composition is applied and then made into a semi-cured state, the resin composition before curing is heated under desired heating conditions, for example, for 1 to 10 minutes at 80 to 170° C. to obtain a resin layer (A stage) or a semi-cured resin layer (B stage) containing the resin composition before curing. After applying the resin varnish (in the case of a prepreg, impregnating with the resin varnish), the organic solvent can be volatilized from the varnish by heating to reduce or remove the organic solvent. Thus, a metal foil with a resin 31 or a resin film 41 having a resin layer (A stage) or a semi-cured resin layer (B stage) is obtained.

The metal foil with a resin 31 and the resin film 41 may have a cover film or the like, if necessary. By having the cover film, it is possible to prevent foreign matter from entering. The cover film is not particularly limited as long as it can be peeled without impairing the form of the resin composition, and for example, a polyolefin film, a polyester film, a TPX film, films prepared by forming a release agent layer on those films, and paper sheets prepared by laminating those films on paper substrates can be used.

Figure 2:
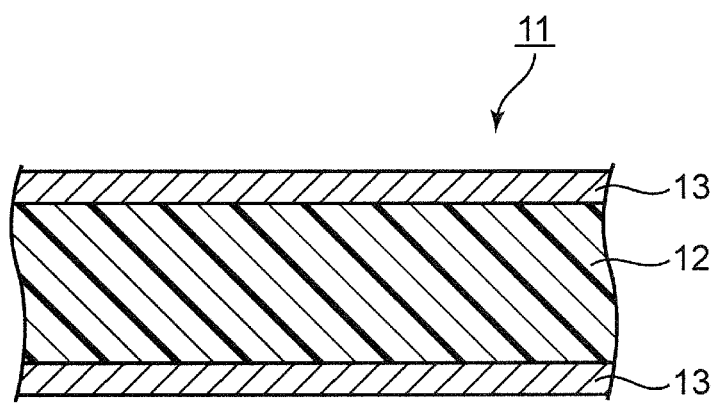
FIG. 2 is a schematic cross-sectional view showing the configuration of a metal-clad laminate according to the embodiment of the present invention.

As shown in FIG. 2, the metal-clad laminate 11 of this embodiment is characterized by having an insulating layer 12 containing a cured product of the resin composition described above or a cured product of the prepreg described above, and a metal foil 13. The metal foil 13 to be used in the metal-clad laminate 11 may be the same as the metal foil 13 described above.

Further, the metal-clad laminate 11 of this embodiment can also be made using the metal foil with a resin 31 or the resin film 41 described above.

As a method for producing a metal-clad laminate using the prepreg 1, the metal foil with a resin 31 or the resin film 41 obtained as described above, a laminate with double-sided metal foil cladding or a single-sided metal foil cladding can be produced by stacking one or a plurality of prepregs 1, metal foils with a resin 31, or resin films 41, overlaying a metal foil 13 such as a copper foil on both or one of the upper and lower sides thereof, and integrally laminating them by heating and press molding. The heating and pressing conditions can be appropriately set according to the thickness of the laminate to be manufactured, the type of the resin composition, etc., and for example, the temperature may be 170 to 220° C., the pressure may be 1.5 to 5.0 MPa, and the time may be 60 to 150 minutes.

Alternatively, the metal-clad laminate 11 may be produced by forming a film-shaped resin composition on a metal foil 13 and then applying heat and pressure without using the prepreg 1 and the like.

Figure 3:
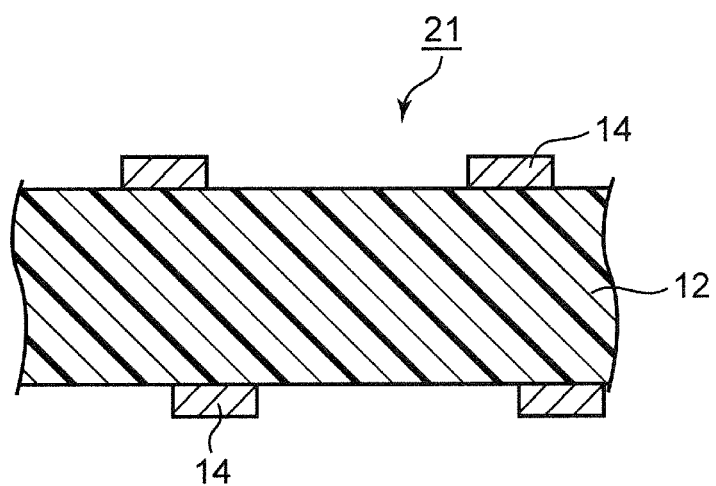
FIG. 3 is a schematic cross-sectional view showing the configuration of a wiring board according to the embodiment of the present invention.

As shown in FIG. 3, the wiring board 21 of this embodiment has an insulating layer 12 containing a cured product of the above resin composition or a cured product of the above prepreg, and a wiring 14.

As a method for manufacturing such a wiring board 21, for example, a wiring board 21 with a conductor pattern (wiring 14) as a circuit formed on the surface of a laminate can be obtained by forming a circuit (wiring) by etching the metal foil 13 provided on the metal-clad laminate 13 obtained above. Examples of a method for forming a circuit include, in addition to the method described above, circuit formation by a semi-additive process (SAP: Semi Additive Process) or a modified semi additive process (MSAP: Modified Semi Additive Process).

The prepreg, the film with resin, and the metal foil with resin prepared using the resin composition of this embodiment are very useful for industrial use because they have good handleability as well as low dielectric properties, high heat resistance, a high Tg, adhesion, and a low water absorption rate of their cured products. Moreover, since they are low in coefficient of thermal expansion, they are also superior in moldability. Further, metal-clad laminates and wiring boards prepared by curing them have high heat resistance, a high Tg, high adhesion, a low water absorption rate, and high conduction reliability.

Although the present description discloses the techniques of various aspects as described above, the main technology among them is summarized below.

The resin composition according to one embodiment of the present invention is characterized by comprising (A) a modified polyphenylene ether compound terminal-modified with a substituent having a carbon-carbon unsaturated double bond, (B) a maleimide compound containing no phenylmaleimide group and having a hydrocarbon group having 10 or more carbon atoms in a molecule thereof, and (C) at least one selected from a maleimide compound containing a phenylmaleimide group and a maleimide compound having an aliphatic hydrocarbon group having 9 or less carbon atoms in a molecule thereof, in which a content ratio of the component (A) to the component (B) is (A):(B) =20:80 to 90:10 in mass ratio.

It is considered that according to such a configuration, it is possible to provide a resin composition having a handleability in a prepreg, a film with resin, a metal foil with resin, etc. containing a resin composition or a semi-cured product thereof as well as low dielectric properties, high heat resistance, a high Tg, a low coefficient of thermal expansion, adhesion, and a low water absorption rate of a cured product produced from the resin composition.

Further, in the resin composition described above, the modified polyphenylene ether compound (A) preferably contains a compound having at least one structure represented by the following formulas (1) to (3).

[Chemical Formula 14]

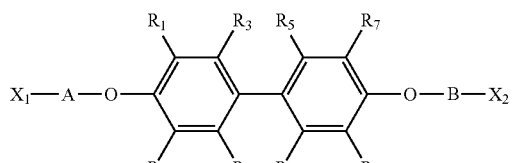

(1)

[Chemical Formula 15]

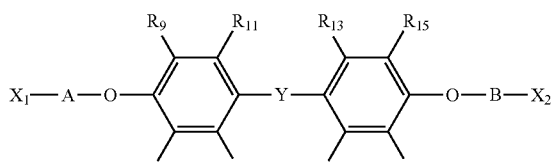

(2)

[Chemical Formula 16]

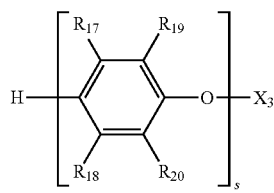

(3)

In the formulas (1) to (3), $R_1$ to $R_8$, $R_9$ to $R_{16}$ and $R_{17}$ to $R_{20}$ each independently represent a hydrogen atom, an alkyl group, an alkenyl group, an alkynyl group, a formyl group, an alkylcarbonyl group, an alkenylcarbonyl group, or an alkynylcarbonyl group.

In the formulas (1) and (2), A and B are structures represented by the following formulas (4) and (5), respectively:

[Chemical Formula 17]

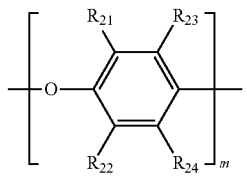

(4)

[Chemical Formula 18]

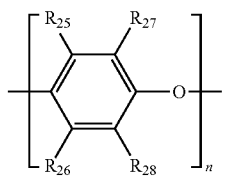

(5)

In the formulas (4) and (5), m and n each represent an integer of 1 to 50, and $R_{21}$ to $R_{24}$ and $R_{25}$ to $R_{28}$ each independently represent a hydrogen atom or an alkyl group.

In the formula (3), s represents an integer of 1 to 100.

Further, in the formula (2), Y is a structure represented by the following formula (6):

[Chemical Formula 19]

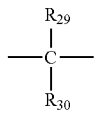

(6)

In the formula (6), $R_{29}$ and $R_{30}$ each independently represent a hydrogen atom or an alkyl group.

$X_1$ to $X_3$ each independently represent a substituent having a carbon-carbon unsaturated double bond represented by the following formula (7) or (8), and $X_1$ and $X_2$ may be either the same or different.

[Chemical Formula 20]

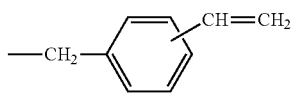

(7)

[Chemical Formula 21]

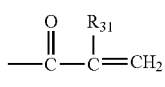

(8)

In the formula (8), $R_{31}$ represents a hydrogen atom or an alkyl group.

It is considered that thanks to such a configuration, the effects described above can be obtained more certainly.

In the resin composition, the weight average molecular weight (Mw) of the modified polyphenylene ether compound (A) is preferably 1000 to 5000. It is considered that this makes it possible to obtain further improved moldability in addition to heat resistance.

Furthermore, in the resin composition, the weight average molecular weight (Mw) of the maleimide compound (B) is preferably 500 to 4000. It is considered that this makes it possible to obtain a resin composition that is superior in moldability and has a further improved low dielectric properties in a cured product thereof.

In the resin composition, the content of the maleimide compound (C) is preferably 5 to 50 parts by mass per 100 parts by mass of the resin component. It is considered that this makes it possible to achieve a high Tg and a low water absorption rate more certainly.

The prepreg according to still another embodiment of the present invention is characterized by having the above-described resin composition or a semi-cured product of the resin composition, and a fibrous base material.

The film with resin according to still another embodiment of the present invention is characterized by having a resin layer containing the above-described resin composition or a semi-cured product of the resin composition, and a support film.

The metal foil with resin according to still another embodiment of the present invention is characterized by having a resin layer containing the above-described resin composition or a semi-cured product of the resin composition, and a metal foil.

The metal-clad laminate according to still another embodiment of the present invention is characterized by having an insulating layer containing a cured product of the above-described resin composition or a cured product of the above-described prepreg, and a metal foil.

A wiring board according to still another aspect of the present invention is characterized by having an insulating layer containing a cured product of the above-described resin composition or a cured product of the above-described prepreg, and wiring.

According to the configurations as described above, it is possible to obtain a prepreg, a film with resin and a metal foil with resin each being superior in handleability, as well as a prepreg, a film with resin, a metal foil with resin, a metal-clad laminate, a wiring board, etc. that each have low dielectric properties, a high Tg, high heat resistance, and a low coefficient of thermal expansion, are superior in adhesion and low water absorption, and are capable of affording substrates having high conduction reliability.

Hereinafter, the present invention will be described more specifically with reference to Examples, but the scope of the present invention is not limited thereto.

EXAMPLES

First, the components to be used in the preparation of resin compositions in the following examples will be described.

<Component A: Modified Polyphenylene Ether Compound>

OPE-2St 1200: terminal-vinylbenzyl-modified PPE (Mw: about 1600, manufactured by Mitsubishi Gas Chemical Company, Inc.)

OPE-2St 2200: terminal-vinylbenzyl-modified PPE (Mw: about 3600, manufactured by Mitsubishi Gas Chemical Company, Inc.)

Modified PPE-1: bifunctional vinylbenzyl-modified PPE (Mw: 1900)

First, a modified polyphenylene ether (modified PPE-1) was synthesized. The average number of the phenolic hydroxyl groups located at the molecular terminals per molecule of polyphenylene ether is referred to as the number of the terminal hydroxyl groups.

Modified polyphenylene ether 1 (modified PPE-1) was obtained by reacting polyphenylene ether with chloromethylstyrene. Specifically, first, 200 g of polyphenylene ether (SA 90 manufactured by SABIC Innovative Plastics Co., Ltd., intrinsic viscosity (IV): 0.083 dl/g, number of terminal hydroxyl groups: 1.9, weight average molecular weight Mw: 1700), 30 g of a mixture of p- and m-chloromethylstyrenes in a mass ratio of 50:50 (chloromethylstyrene: CMS manufactured by Tokyo Chemical Industry Co., Ltd.), 1.227 g of tetra-n-butylammonium bromide as a phase-transfer catalyst, and 400 g of toluene were placed in a 1-liter three-necked flask equipped with a temperature controller, a stirrer, a cooling facility and a dropping funnel, and the mixture was stirred. Then, stirring was continued until the polyphenylene ether, chloromethylstyrene, and tetra-n-butylammonium bromide were dissolved in toluene. During the stirring process, the contents were gradually heated until the solution temperature reached 75° C. finally. Then, as the alkali metal hydroxide, an aqueous solution of sodium hydroxide (20 g of sodium hydroxide/20 g of water) was dropped in the solution over 20 minutes. Then, the solution was further stirred for 4 hours at 75° C. Subsequently, the contents in the flask were neutralized with 10% by mass of hydrochloric acid, and then a large amount of methanol was added thereto. By doing so, a precipitate was formed in the liquid in the flask. That is, the product contained in the reaction solution in the flask was reprecipitated. Then, this precipitate was taken out by filtration, washed three times with a mixed solution of methanol and water having a mass ratio of 80:20, and then dried under reduced pressure at 80° C. for 3 hours.

The obtained solid was analyzed with $^1$H-NMR (400 MHz, CDCl$_3$, TMS). As a result of the NMR measurement, a peak derived from ethenylbenzyl was confirmed at 5 to 7 ppm. From this, it was confirmed that the obtained solid was polyphenylene ether ethenylbenzylated at a molecular end.

Further, the molecular weight distribution of the modified polyphenylene ether was measured using GPC. Then, the weight average molecular weight (Mw) was calculated from the obtained molecular weight distribution, and the Mw was found to be 1900.

In addition, the number of the terminal functional groups of the modified polyphenylene ether compound was determined as follows.

First, the modified polyphenylene ether compound was accurately weighed. The weight at that time was X (mg). The weighed modified polyphenylene ether was dissolved in 25 ml of methylene chloride. To the solution was added a 100 µl ethanol solution of 10% by mass of tetraethylammonium hydroxide (TEAH) (TEAH:ethanol (volume ratio)=15:85). Then, the absorbance (Abs) at 318 nm was measured with a UV spectrophotometer (UV-1600 manufactured by Shimadzu Corporation). From the measurement result, the number of the terminal hydroxyl groups in the modified polyphenylene ether compound was calculated using the following formula.

$$\text{Amount of residual OH } (\mu\text{mol/g}) = [(25 \times \text{Abs})/(\varepsilon \times \text{OPL} \times X)] \times 10^6$$

In the present specification, ε represents an absorption coefficient and is 4700 L/mol·cm. OPL is the cell optical path length and is 1 cm.

Since the calculated amount of residual OH (the number of the terminal hydroxyl groups) in the modified polyphenylene ether was almost zero, it was found that most of the hydroxyl groups in the unmodified polyphenylene ether was modified. From the above description, it was understood that the decrease from the number of the terminal hydroxyl groups in the polyphenylene ether before modification was the number of the terminal hydroxyl groups in the polyphenylene ether before modification. That is, the number of the terminal hydroxyl groups in the unmodified polyphenylene ether was found to be the number of the terminal functional groups in the modified polyphenylene ether. That is, the number of the terminal functional groups was 1.8. This is referred to as "modified PPE-1".

SA-9000: bifunctional methacrylate-modified PPE (Mw: 1700, manufactured by SABIC)

Modified PPE-2: monofunctional vinylbenzyl-modified PPE (Mw: 2800)

First, 36 parts by mass of polyphenylene ether resin (manufactured by Japan GE Plastics Co., Ltd.: trade name "Noryl PX9701", number average molecular weight: 14000), 1.44 parts by mass of bisphenol A as a phenolic species, and 1.90 parts by mass of benzoyl peroxide (manufactured by NOF Corporation, trade name "Nyper BW") as an initiator were blended, and 90 parts by mass of toluene, which was a solvent, was added thereto. The mixture was mixed at 80° C. for 1 hour, dispersed, dissolved and reacted. Thus, a treatment to reduce the molecular weight of a polyphenylene resin was carried out. Then, the product was reprecipitated with a large amount of methanol to remove impurities, and was dried under reduced pressure at 80° C. for 3 hours to completely remove the solvent. The number average molecular weight of the polyphenylene ether compound obtained after this treatment was about 2400 as measured by gel permeation chromatography (GPC).

Next, the target modified polyphenylene ether compound was produced by ethenylbenzylating the phenol groups located at the molecular terminals of the polyphenylene ether compound obtained as described above.

Specifically, into a 1-liter three-necked flask equipped with a temperature controller, a stirrer, a cooling facility, and a dropping funnel were added 200 g of the polyphenylene ether compound described above, 14.51 g of chloromethylstyrene, 0.818 g of tetra-n-butylammonium bromide, and 400 g of toluene, and the mixture was stirred and dissolved. The mixture was heated to a liquid temperature of 75° C., and an aqueous solution of sodium hydroxide (11 g of sodium hydroxide/11 g of water) was added dropwise over 20 minutes and the resulting mixture was stirred at 75° C. for additional 4 hours. Then, the solution in the flask was neutralized with a 10% aqueous hydrochloric acid solution, and a large amount of methanol was added thereto to reprecipitate the ethenylbenzylated modified polyphenylene ether compound, which was then collected by filtration. The filtered product was washed three times with a mixed solution of methanol and water at the ratio of 80 to 20, and then treated at 80° C. for 3 hours under reduced pressure, whereby an ethenylbenzylated modified polyphenylene ether compound, from which the solvent and water had been removed, was taken out. This is referred to as "modified PPE-2".

The molecular weight distribution of the modified PPE-2 was measured using GPC. Then, the weight average molecular weight (Mw) was calculated from the obtained molecular weight distribution, so that the Mw was found to be 2800.

Further, the number of the terminal functionalities of the modified PPE-2 was determined by the same method as the modified PPE-1, and was found to be about 1.

SA90: non-modified PPE, (Mw: 1700, manufactured by SABIC Innovative Plastics Co., Ltd.)

PPO640: non-modified PPE, (Mw: 18000, manufactured by SABIC Innovative Plastics Co., Ltd.)

<Component B: Maleimide Compound>

BMI-689: maleimide compound represented by the formula (11) (Mw: 689, manufactured by Designer Molercules Inc.)

BMI-1500: maleimide compound represented by the formula (9) (Mw: 1500, manufactured by Designer Molercules Inc.)

BMI-1700: maleimide compound represented by the formula (10) (Mw: 1700, manufactured by Designer Molercules Inc.)

BMI-3000J: maleimide compound represented by the formula (12) (Mw: 3000, manufactured by Designer Molercules Inc.)

<Component C: Other Maleimide Compound>

BMI-4000: bisphenol A diphenyl ether bismaleimide (functional group equivalent of maleimide groups: 285 g/eq., manufactured by Daiwa Kasei Industry Co., Ltd.)

MIR-3000: biphenylaralkyl type polymaleimide compound represented by the formula (13) (functional group equivalent of the maleimide groups 275 g/eq., manufactured by Nippon Kayaku Co., Ltd.)

BMI-2300: polyphenylmethane maleimide (functional group equivalent of maleimide groups: 180 g/eq., manufactured by Daiwa Kasei Industry Co., Ltd.)

BMI-TMH: 1,6-bismaleimide-(2,2,4-trimethyl)hexane (functional group equivalent of maleimide groups 159 g/eq., manufactured by Daiwa Kasei Industry Co., Ltd.)

<Other Components>

DABPA: 2,2'-diallylbisphenol A (manufactured by Daiwa Kasei Industry Co., Ltd.)

S8000L: hydrogenated styrene/butadiene/styrene copolymer (Mw: about 100,000, manufactured by Kuraray Co., Ltd.)

(Reaction Initiator)

Perbutyl P: 1,3-bis(butylperoxyisopropyl)benzene (manufactured by NOF Corporation)

(Inorganic Filler)

SC2500-SXJ: phenylaminosilane-surface treated spherical silica (manufactured by Admatechs Co., Ltd.)

Examples 1 to 19, Comparative Examples 1 to 10

[Preparation Method](Resin Varnish)

First, each component was added to methyl ethyl ketone at a compounding ratio shown in Tables 1 and 2 such that the solid content concentration became 60% by mass and then mixed together. The mixture was stirred for 60 minutes to afford a varnish-like resin composition (varnish). Only in Example 9 and Comparative Example 2, a solvent having a methyl ethyl ketone/toluene ratio of about 50:50 was used.

(Prepreg)

—Preparation of Prepreg-I

Glass cloth (#2116 E-glass, manufactured by Asahi Kasei Corporation) was impregnated with each resin varnish of the Examples and the Comparative Examples, and the resulting material was then heated and dried at 100 to 170° C. for about 3 to 6 minutes to afford a prepreg. At that time, the content of the resin composition (resin content) based on the weight of the prepreg was adjusted to about 46% by mass.

—Preparation of Prepreg-II

Glass cloth (#1067 E-glass, manufactured by Asahi Kasei Corporation) was impregnated with each resin varnish of the Examples and the Comparative Examples, and the resulting material was then heated and dried at 100 to 170° C. for about 3 to 6 minutes to afford a prepreg. At that time, the content of the resin composition (resin content) based on the weight of the prepreg was adjusted to about 73% by mass.

(Copper-Clad Laminate)

One sheet of the above prepreg-I was processed into a body to be pressed by disposing a 12 μm thick copper foil (GT-MP manufactured by Furukawa Electric Co., Ltd.) on both sides of the prepreg, and the body was heated and pressed at a temperature of 220° C. and a pressure of 30 kgf/cm² for 90 minutes under a vacuum condition, and thus, about 0.1 mm thick copper-clad laminate-I with a copper foil adhered on both sides thereof was obtained. Further, eight sheets of the above prepreg were stacked, and copper-clad laminate-II having a thickness of about 0.8 mm was obtained by the same method.

Further, 12 sheets of the above prepreg-II were stacked, and copper-clad laminate-III having a thickness of about 0.8 mm was obtained by the same method.

<Evaluation Test 1>

(Glass Transition Temperature (Tg))

The outer layer copper foil of the copper-clad laminate-I was completely etched, and the Tg of the obtained sample was measured using a viscoelasticity spectrometer "DMS100" manufactured by Seiko Instruments Inc. In the measurement, dynamic mechanical analysis (DMA) was carried out at a frequency of 10 Hz with a tensile module, and the Tg was defined as a temperature at which tan δ showed a local maximal value when the temperature was raised from room temperature up to 300° C. under a condition with a temperature raising speed of 5° C./minute.

(Oven Heat Resistance)

Heat resistance was evaluated according to JIS C6481 (1996). The copper-clad laminate-I cut into a prescribed size was left in a thermostat set at 290° C. for 1 hour and then taken out. Then, the heat-treated specimen was visually observed, and when the blisters did not occur at 290° C., it was evaluated as "good", and when the blisters occurred at 280° C., it was evaluated as "poor".

(Coefficient of Thermal Expansion (CTE-Z))

The copper foil laminate-II from which the copper foil had been removed was used as a test piece, and the coefficient of thermal expansion in the Z-axis direction at a temperature lower than the glass transition temperature of the cured resin product was measured by a TMS method (Thermo-mechanical analysis) in accordance with JIS C 6481. The measurement was performed in the range of 30 to 300° C. using a TMA device ("TMA6000" manufactured by SII NanoTechnology Inc.). The unit of measurement is ppm/° C.

(Copper Foil Adhesion Force)

In the copper foil-clad laminate-I, the peel strength of the copper foil from the insulating layer was measured according to JIS C 6481. A pattern with a width of 10 mm and a length of 100 mm was formed. It was then peel off at a speed of 50 mm/min with a tensile tester and the peeling strength at this time was measured, and the peeling strength obtained as taken as a copper foil adhesion strength. The unit of measurement is kN/m.

(Dielectric Property: Dielectric Loss Tangent (Df))

The dielectric loss tangent (Df) was measured by the cavity resonator perturbation method using a laminate obtained by removing the copper foil from the above copper-clad laminate-III as an evaluation substrate. Specifically, the dielectric loss tangent of the evaluation substrate at 10 GHz was measured by using a network analyzer (N5230A manufactured by Agilent Technologies Japan, Ltd.).

(Water Absorption Rate)

The water absorption rate was measured in accordance with JIS-C6481 (1996) using a laminate obtained by removing the copper foil from the above copper-clad laminate-III as an evaluation substrate. The water absorption condition was E-24/50+D-24/23 (that is, treating at 50° C. in a constant temperature air for 24 hours+at 23° C. in a constant temperature water for 24 hours). The water absorption rate was calculated based on the following formula.

Water absorption rate (%)=((mass after water absorption−mass before water absorption)/mass before water absorption)×100

(Handleability and Powder Falling Test)

When a prepreg is handled, for example, when a prepreg is manufactured or cut, a powder of the resin composition may fall from the prepreg. That is, powder falling may occur.

In this evaluation test, when the prepreg-I was cut with a box cutter, the case where the occurrence of such powder falling was not observed was evaluated as "good", and the case where the occurrence of powder falling was observed was evaluated as "poor".

The above results are shown in Tables 1 to 3.

TABLE 1

| | | | Example 1 | Example 2 | Example 3 | Example 4 | Example 5 | Example 6 | Example 7 |
|---|---|---|---|---|---|---|---|---|---|
| (A) | OPE-2St 1200 | Terminal-vinylbenzyl-modified PPE | 40 | 40 | | | | | 40 |
| | OPE-2St 2200 | Terminal-vinylbenzyl-modified PPE | | | 40 | | | | |
| | Modified PPE-1 | Terminal-vinylbenzyl-modified PPE | | | | 40 | | | |
| | SA9000 | Terminal-methacrylate-modified PPE | | | | | 40 | | |
| | Modified PPE-2 | Terminal-vinylbenzyl-modified PPE | | | | | | 40 | |
| | SA90 | Non-modified PPE | | | | | | | |
| | PPO640 | Non-modified PPE | | | | | | | |
| (B) | BMI-680 | | 30 | 30 | 30 | 30 | 30 | 30 | |
| | BMI-1500 | | | | | | | | 30 |
| | BMI-1700 | | | | | | | | |
| | BMI-3000J | | | | | | | | |

TABLE 1-continued

|  |  |  |  |  |  |  |  |  |  |
|---|---|---|---|---|---|---|---|---|---|
| (C) | BMI-4000 |  | 30 | 30 | 30 | 30 | 30 | 30 | 30 |
|  | MIR-3000 |  |  |  |  |  |  |  |  |
|  | BMI-2300 |  |  |  |  |  |  |  |  |
|  | BMI-TMH |  |  |  |  |  |  |  |  |
|  | DABPA | Allylphenol |  |  |  |  |  |  |  |
|  | S8007L | Hydrogenated SBS copolymer |  |  |  |  |  |  |  |
| Peroxide | Perbutyl P | Peroxide |  | 1 | 1 | 1 | 1 | 1 | 1 |
| Inorganic filler | SC2500-SXJ | Silica | 125 | 125 | 125 | 125 | 125 | 125 | 125 |
| Evaluation test | Tg | ° C. | 255 | 260 | 240 | 240 | 240 | 230 | 260 |
|  | Oven heat resistance |  | good | good | good | good | good | good | good |
|  | CTE-Z | ppm/° C. | 33 | 30 | 30 | 30 | 30 | 35 | 30 |
|  | Cu peel | kN/m | 0.75 | 0.75 | 0.75 | 0.75 | 0.75 | 0.75 | 0.75 |
|  | Df @10 GHz | — | 0.0038 | 0.0040 | 0.0040 | 0.0040 | 0.0040 | 0.0037 | 0.0040 |
|  | Water absorption rate | % | 0.18 | 0.20 | 0.20 | 0.20 | 0.20 | 0.20 | 0.20 |
|  | Handling of PP |  | good | good | good | good | good | good | good |

|  |  |  | Example 8 | Example 9 | Example 10 | Example 11 | Example 12 | Example 13 |
|---|---|---|---|---|---|---|---|---|
| (A) | OPE-2St 1200 | Terminal-vinylbenzyl-modified PPE | 40 | 40 | 40 | 40 | 40 | 40 |
|  | OPE-2St 2200 | Terminal-vinylbenzyl-modified PPE |  |  |  |  |  |  |
|  | Modified PPE-1 | Terminal-vinylbenzyl-modified PPE |  |  |  |  |  |  |
|  | SA9000 | Terminal-methacrylate-modified PPE |  |  |  |  |  |  |
|  | Modified PPE-2 | Terminal-vinylbenzyl-modified PPE |  |  |  |  |  |  |
|  | SA90 | Non-modified PPE |  |  |  |  |  |  |
|  | PPO640 | Non-modified PPE |  |  |  |  |  |  |
| (B) | BMI-680 |  |  |  |  | 15 | 30 | 30 | 30 |
|  | BMI-1500 |  |  |  |  | 15 |  |  |  |
|  | BMI-1700 |  | 30 |  |  |  |  |  |  |
|  | BMI-3000J |  |  | 30 |  |  |  |  |  |
| (C) | BMI-4000 |  | 30 | 30 | 30 |  |  |  |  |
|  | MIR-3000 |  |  |  |  | 30 |  |  |  |
|  | BMI-2300 |  |  |  |  |  | 30 |  |  |
|  | BMI-TMH |  |  |  |  |  |  | 30 |  |
|  | DABPA | Allylphenol |  |  |  |  |  |  |
|  | S8007L | Hydrogenated SBS copolymer |  |  |  |  |  |  |
| Peroxide | Perbutyl P | Peroxide | 1 | 1 | 1 | 1 | 1 | 1 |
| Inorganic filler | SC2500-SXJ | Silica | 125 | 125 | 125 | 125 | 125 | 125 |
| Evaluation test | Tg | ° C. | 260 | 260 | 260 | 260 | 260 | 260 |
|  | Oven heat resistance |  | good | good | good | good | good | good |
|  | CTE-Z | ppm/° C. | 30 | 30 | 30 | 30 | 30 | 30 |
|  | Cu peel | kN/m | 0.75 | 0.75 | 0.75 | 0.75 | 0.75 | 0.75 |
|  | Df @10 GHz | — | 0.0040 | 0.0040 | 0.0040 | 0.0040 | 0.0042 | 0.0040 |
|  | Water absorption rate | % | 0.20 | 0.18 | 0.20 | 0.20 | 0.25 | 0.25 |
|  | Handling of PP |  | good | good | good | good | good | good |

TABLE 2

|  |  |  | Example 14 | Example 15 | Example 16 | Example 17 |
|---|---|---|---|---|---|---|
| (A) | OPE-2St 1200 | Terminal-vinylbenzyl-modified PPE | 56 | 54 | 51 | 46 |

TABLE 2-continued

|   |   |   |   |   |   |   |
|---|---|---|---|---|---|---|
| | OPE-2St 2200 | Terminal-vinylbezyl-rnodified PPE | | | | |
| | Modified PPE-1 | Terminal-vinylbenzyl-modified PPE | | | | |
| | SA9000 | Terminal-methacrylate-modified PPE | | | | |
| | Modified PPE-2 | Terminal-vinylbenzyl-modified PPE | | | | |
| | SA90 | Non-modified PPE | | | | |
| | PP0640 | Non-modified PPE | | | | |
| (B) | BMI-689 | | 42 | 40 | 39 | 34 |
| | BMI-1500 | | | | | |
| | BMI-1700 | | | | | |
| | BMI-3000J | | | | | |
| (C) | BMI-4000 | | 2 | 6 | 10 | 20 |
| | MIR-3000 | | | | | |
| | BMI-2300 | | | | | |
| | BMI-TMH | | | | | |
| | DABPA | Allylphenol | | | | |
| | S8007L | Hydrogenated SBS copolymer | | | | |
| Peroxide | Perbutyl P | Peroxide | 1 | 1 | 1 | 1 |
| Inorganic filler | SC2500-SXJ | Silica | 125 | 125 | 125 | 125 |
| Evaluation test | Tg | °C. | 220 | 240 | 240 | 250 |
| | Oven heat resistance | | good | good | good | good |
| | CTE-Z | ppm/°C. | 45 | 40 | 40 | 30 |
| | Cu peel | kN/m | 0.70 | 0.75 | 0.75 | 0.75 |
| | Df @10 GHz | — | 0.0035 | 0.0037 | 0.0038 | 0.0040 |
| | Water absorption rate | % | 0.10 | 0.13 | 0.15 | 0.18 |
| | Handling of PP | | good | good | good | good |

|   |   |   |   | Example 18 | Example 19 | Example 20 |
|---|---|---|---|---|---|---|
| | (A) | OPE-2St 1200 | Terminal-vinylbenzyl-modified PPE | 29 | 14 | 63 |
| | | OPE-2St 2200 | Terminal-vinylbezyl-rnodified PPE | | | |
| | | Modified PPE-1 | Terminal-vinylbenzyl-modified PPE | | | |
| | | SA9000 | Terminal-methacrylate-modified PPE | | | |
| | | Modified PPE-2 | Terminal-vinylbenzyl-modified PPE | | | |
| | | SA90 | Non-modified PPE | | | |
| | | PP0640 | Non-modified PPE | | | |
| | (B) | BMI-689 | | 21 | 56 | 7 |
| | | BMI-1500 | | | | |
| | | BMI-1700 | | | | |
| | | BMI-3000J | | | | |
| | (C) | BMI-4000 | | 50 | 30 | 30 |
| | | MIR-3000 | | | | |
| | | BMI-2300 | | | | |
| | | BMI-TMH | | | | |
| | | DABPA | Allylphenol | | | |
| | | S8007L | Hydrogenated SBS copolymer | | | |
| | Peroxide | Perbutyl P | Peroxide | 1 | 1 | 1 |
| | Inorganic filler | SC2500-SXJ | Silica | 125 | 125 | 125 |
| | Evaluation test | Tg | °C. | 280 | 220 | 270 |
| | | Oven heat resistance | | good | good | good |

TABLE 2-continued

|  |  |  |  |  |  |
|---|---|---|---|---|---|
| CTE-Z | ppm/° C. | 30 | 40 | 30 |
| Cu peel | kN/m | 0.70 | 0.60 | 0.70 |
| Df @10 GHz | — | 0.0045 | 0.0038 | 0.0040 |
| Water absorption rate | % | 0.30 | 0.20 | 0.20 |
| Handling of PP | | good | good | good |

TABLE 3

| | | | Comparative Example 1 | Comparative Example 2 | Comparative Example 3 | Comparative Example 4 | Comparative Example 5 |
|---|---|---|---|---|---|---|---|
| (A) | OPE-2St 1200 | Terminal-vinylbenzyl-modified PPE | | 40 | | | 57 |
| | OPE-2St 2200 | Terminal-vinylbenzyl-modified PPE | | | | | |
| | Modified PPE-1 | Terminal-vinylbenzyl-modified PPE | | | | | |
| | SA9000 | Terminal-methacrylate-modified PPE | | | | | |
| | Modified PPE-2 | Terminal-vinylbenzyl-modified PPE | | | | | |
| | SA90 | Non-modified PPE | | | 40 | | |
| | PPO640 | Non-modified PPE | | | | 40 | |
| (B) | BMI-689 | | 30 | | 30 | 40 | 43 |
| | BMI-1500 | | | | | | |
| | BMI-1700 | | | | | | |
| | BMI-3000J | | | | | | |
| (C) | BMI-4000 | | 30 | 30 | 30 | 30 | |
| | MIR-3000 | | | | | | |
| | BMI-2300 | | | | | | |
| | BMI-TMH | | | | | | |
| | DABPA | Allylphenol | 40 | | | | |
| | S8007L | Hydrogenated SBS copolymer | | 30 | | | |
| Peroxide | Perbutyl P | Peroxide | 1 | 1 | 1 | 1 | 1 |
| Inorganic filter | SC2500-SXJ | Silica | 125 | 125 | 125 | 125 | 125 |
| Evaluation test | Tg | ° C. | 220 | 260 | 170 | 180 | 160 |
| | Oven heat resistance | | good | poor | poor | poor | good |
| | CTE-Z | ppm/° C. | 30 | 35 | 45 | 45 | 50 |
| | Cu peel | kN/m | 0.55 | 0.75 | 0.55 | 0.55 | 0.55 |
| | Df @10 GHz | — | 0.009 | 0.0040 | 0.006 | 0.006 | 0.0035 |
| | Water absorption rate | % | 0.60 | 0.20 | 0.30 | 0.30 | 0.15 |
| | Handling of PP | | good | poor | good | good | good |

| | | | Comparative Example 6 | Comparative Example 7 | Comparative Example 8 | Comparative Example 9 | Comparative Example 10 |
|---|---|---|---|---|---|---|---|
| (A) | OPE-2St 1200 | Terminal-vinylbenzyl-modified PPE | 57 | | | 7 | 66.5 |
| | OPE-2St 2200 | Terminal-vinylbenzyl-modified PPE | | | | | |
| | Modified PPE-1 | Terminal-vinylbenzyl-modified PPE | | | | | |
| | SA9000 | Terminal-methacrylate-modified PPE | | | | | |
| | Modified PPE-2 | Terminal-vinylbenzyl-modified PPE | | | | | |

TABLE 3-continued

| | | | | | | | |
|---|---|---|---|---|---|---|---|
| | SA90 | Non-modified PPE | | | | | |
| | PPO640 | Non-modified PPE | | | | | |
| (B) | BMI-689 | | | 50 | 50 | 63 | 3.5 |
| | BMI-1500 | | | | | | |
| | BMI-1700 | | | | | | |
| | BMI-3000J | | | | | | |
| (C) | BMI-4000 | | 43 | 50 | 50 | 30 | 30 |
| | MIR-3000 | | | | | | |
| | BMI-2300 | | | | | | |
| | BMI-TMH | | | | | | |
| | DABPA | | | | | | |
| | S8007L | Allylphenol Hydrogenated SBS copolymer | | | | | |
| Peroxide | Perbutyl P | Peroxide | 1 | 1 | | 1 | 1 |
| Inorganic filter | SC2500-SXJ | Silica | 125 | 125 | 125 | 125 | 125 |
| Evaluation test | Tg | °C. | 270 | 200 | 130 | 200 | 270 |
| | Oven heat resistance | | good | good | poor | good | good |
| | CTE-Z | ppm/°C. | 25 | 30 | 60 | 50 | 30 |
| | Cu peel | kN/m | 0.4 | 0.4 | 0.30 | 0.60 | 0.70 |
| | Df @10 GHz | — | 0.0055 | 0.0045 | 0.0045 | 0.0038 | 0.0045 |
| | Water absorption rate | % | 0.40 | 0.30 | 0.30 | 0.20 | 0.20 |
| | Handling of PP | | poor | good | good | good | poor |

(Discussion)

As is clear from the results shown in Tables 1 to 3, it was shown that the present invention can provide a resin composition having high heat resistance, a high Tg (220° C. or more), and superior adhesion (peel 0.60 kN/m or more) in the cured product thereof in addition to low dielectric properties (Df: 0.0045 or less). Furthermore, in each of the examples, the coefficient of thermal expansion (CTE) was 45° C./ppm or lower, which was relatively low.

In particular, it was found that by setting the content of the component (C) within the preferable range, a cured product having a higher Tg, a low water absorption rate and a low coefficient of thermal expansion can be obtained (Examples 14 to 16).

On the other hand, in Comparative Example 1, in which another curing agent (allylphenol) was used instead of the modified polyphenylene ether compound (A), sufficient low dielectric properties and adhesion were not obtained, and the water absorption rate was also deteriorated. In Comparative Example 3 and 4, in which non-modified PPE was used instead of the modified polyphenylene ether compound (A), sufficient low dielectric properties and a high Tg were not obtained, and the heat resistance was deteriorated.

Further, in Comparative Example 2, in which the thermoplastic elastomer was used instead of the maleimide compound (B), the adhesion and the low dielectric properties could be obtained to some extent, but the heat resistance was deteriorated, and the handleability when the prepreg was formed was also bad.

Furthermore, in Comparative Example 5, in which no component (C) of the present invention was not contained, Tg lowered and the coefficient of thermal expansion also increased. On the other hand, in Comparative Example 6, in which the component (B) of the present invention was not contained, sufficient low dielectric properties were not obtained, the water absorption rate increased, and the toughness decreased, so that the adhesion also decreased.

In Comparative Example 7, in which the component (A) of the present invention was not contained, the reaction progress of the resin composition was delayed, so that a high Tg was not obtained. Further, since the toughness also decreased, the adhesion also decreased. In Comparative Example 8, in which the component (A) of the present invention was not contained and any reaction initiator (peroxide) was not contained, curing did not sufficiently occur. Thus, sufficient results could not be obtained for Tg, heat resistance, and coefficient of thermal expansion.

It was confirmed that when the blending ratio of the component (B) to the component (A) of the present invention is excessively high, the coefficient of thermal expansion is large. It was also shown that when the amount of the component (A) is excessively large with respect to the amount of the component (B), a prepreg formed is poor in handleability (powder falling).

This application is based on Japanese Patent Application No. 2018-63240 filed on Mar. 28, 2018, the content of which is incorporated in the present application.

In order to embody the present invention, the present invention has been appropriately and sufficiently described through the embodiments with reference to the specific examples and the drawings in the above, but it should be recognized that those skilled in the art can easily modify and/or improve the above-described embodiments. Therefore, as long as modifications or improvements carried out by a person skilled in the art do not depart from the scope of the claims described in the patent claims of the present invention, these modifications or improvements are interpreted as being encompassed by the scope of the claims.

INDUSTRIAL APPLICABILITY

The present invention has wide industrial applicability in the technical field relating to electronic materials and various devices using the same.

The invention claimed is:

1. A resin composition, comprising:
   (A) a modified polyphenylene ether compound terminal-modified with a substituent having a carbon-carbon unsaturated double bond;
   (B) a maleimide compound containing no phenylmaleimide group and having a hydrocarbon group having 10 or more carbon atoms in a molecule thereof; and
   (C) at least one selected from a maleimide compound containing a phenylmaleimide group and a maleimide compound having an aliphatic hydrocarbon group having 9 or less carbon atoms in a molecule thereof,
   wherein a content ratio of the component (A) to the component (B) is (A):(B)=20:80 to 90:10 in mass ratio, and
   an insulating layer comprising a cured product of the resin composition has a water absorption rate of 0.3% or less.

2. The resin composition according to claim 1, wherein the modified polyphenylene ether compound (A) comprises a compound having at least one structure represented by following formulas (1) to (3),

[Chemical Formula 1]

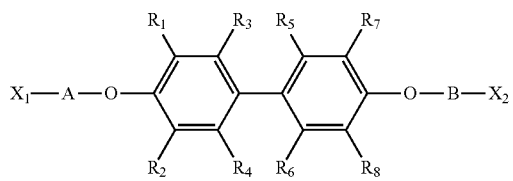

(1)

[Chemical Formula 2]

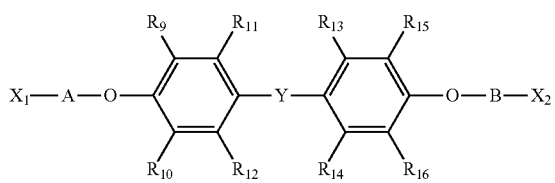

(2)

[Chemical Formula 3]

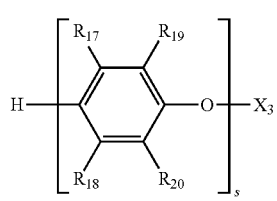

(3)

in the formulas (1) to (3), $R_1$ to $R_8$, $R_9$ to $R_{16}$ and $R_{17}$ to $R_{20}$ each independently represent a hydrogen atom, an alkyl group, an alkenyl group, an alkynyl group, a formyl group, an alkylcarbonyl group, an alkenylcarbonyl group, or an alkynylcarbonyl group, and
in the formulas (1) and (2), A and B are structures represented by following formulas (4) and (5), respectively,

[Chemical Formula 4]

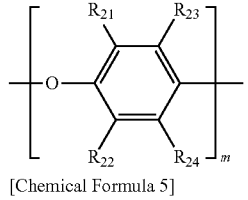

(4)

[Chemical Formula 5]

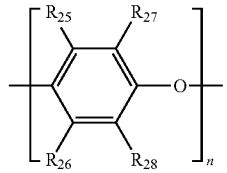

(5)

in the formulas (4) and (5), m and n each represent an integer of 1 to 50, and $R_{21}$ to $R_{24}$ and $R_{25}$ to $R_{28}$ each independently represent a hydrogen atom or an alkyl group,
in the formula (3), s represents an integer of 1 to 100, and
in the formula (2), Y is a structure represented by a following formula (6),

[Chemical Formula 6]

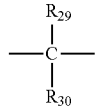

(6)

in the formula (6), $R_{29}$ and $R_{30}$ each independently represent a hydrogen atom or an alkyl group,
$X_1$ to $X_3$ each independently represent a substituent having a carbon-carbon unsaturated double bond represented by a following formula (7) or (8),
and $X_1$ and $X_2$ may be either same or different,

[Chemical Formula 7]

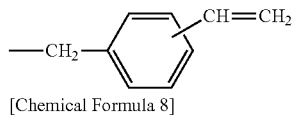

(7)

[Chemical Formula 8]

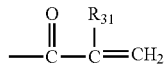

(8)

in the formula (8), $R_{31}$ represents a hydrogen atom or an alkyl group.

3. The resin composition according to claim 1, wherein the modified polyphenylene ether compound (A) has a weight average molecular weight (Mw) of 1000 to 5000.

4. The resin composition according to claim 1, wherein the maleimide compound (B) has a weight average molecular weight (Mw) of 500 to 4000.

5. The resin composition according to claim 1, wherein a content of the maleimide compound (C) is 5 to 50 parts by mass per 100 parts by mass of a resin component.

6. A prepreg, comprising:
the resin composition according to claim 1 or a semi-cured product of the resin composition; and
a fibrous base material.

7. A film with resin, comprising:
a resin layer comprising the resin composition according to claim 1 or a semi-cured product of the resin composition; and
a support film.

8. A metal foil with resin, comprising:
a resin layer comprising the resin composition according to claim 1 or a semi-cured product of the resin composition; and
a metal foil.

9. A metal-clad laminate, comprising:
an insulating layer comprising a cured product of the resin composition according to claim 1; and
a metal foil.

10. A wiring board, comprising:
an insulating layer comprising a cured product of the resin composition according to claim 1; and
a wiring.

11. A metal-clad laminate, comprising:
an insulating layer comprising a cured product of the prepreg according to claim 6; and
a metal foil.

12. A wiring board, comprising:
an insulating layer comprising a cured product of the prepreg according to claim 6; and
a wiring.

13. A prepreg comprising a resin composition, which comprises:

(A) a modified polyphenylene ether compound terminal-modified with a substituent having a carbon-carbon unsaturated double bond;

(B) a maleimide compound containing no phenylmaleimide group and having a hydrocarbon group having 10 or more carbon atoms in a molecule thereof; and (C) at least one selected from a maleimide compound containing a phenylmaleimide group and a maleimide compound having an aliphatic hydrocarbon group having 9 or less carbon atoms in a molecule thereof, wherein a content ratio of the component (A) to the component (B) is (A):(B)=20:80 to 90:10 in mass ratio, and a cured product of the prepreg has a water absorption rate of 0.3% or less.

* * * * *